United States Patent [19]

Izumi et al.

[11] Patent Number: 5,140,643
[45] Date of Patent: Aug. 18, 1992

[54] PART MOUNTING APPARATUS WITH SINGLE VIEWING CAMERA VIEWING PART FROM DIFFERENT DIRECTIONS

[75] Inventors: Yasuo Izumi, Ikoma; Masanori Yasutake, Hirakata, both of Japan

[73] Assignee: Matsushita Electric Industries Co., Ltd., Osaka, Japan

[21] Appl. No.: 634,305

[22] Filed: Dec. 27, 1990

[30] Foreign Application Priority Data

Dec. 28, 1989 [JP] Japan .................................. 1-341538

[51] Int. Cl.[5] .............................................. G06K 9/00
[52] U.S. Cl. ........................................ 382/8; 382/1; 358/101; 358/106
[58] Field of Search .................. 358/101, 106; 382/1, 382/8, 48; 364/478, 479

[56] References Cited

U.S. PATENT DOCUMENTS

| | | | |
|---|---|---|---|
| 4,494,139 | 1/1985 | Shima et al. | 358/101 |
| 4,686,565 | 8/1987 | Ando | 358/101 |
| 4,759,073 | 7/1988 | Shah et al. | 358/101 |
| 4,914,513 | 4/1990 | Spigarelli et al. | 358/101 |
| 4,965,665 | 10/1990 | Amir | 358/101 |

*Primary Examiner*—Jose Couso
*Attorney, Agent, or Firm*—Wenderoth, Lind & Ponack

[57] ABSTRACT

A part mounting apparatus which includes a part holding/transfer device which holds the part at a part supply position for transfer up to a predetermined part mounting position for mounting, a recognizing device for recognizing a shape of the part held by the part holding/transfer device, and an inclined mirror device for inputting into a recognizing device, an image of the shape of the part in a direction perpendicular to a direction of an optical axis of the recognizing device.

7 Claims, 7 Drawing Sheets

PART MOUNTING APPARATUS WITH SINGLE VIEWING CAMERA VIEWING PART FROM DIFFERENT DIRECTIONS

BACKGROUND OF THE INVENTION

The present invention generally relates to handling of electronic parts or components, and more particularly, to a part mounting apparatus to be utilized for attracting and mounting electronic parts or components onto a printed circuit board and the like.

Conventionally, in the case where electronic parts are to be mounted on a printed circuit board, it has been a general practice to attract the electronic part onto an attracting or suction nozzle at a part supply position, and then to displace the attracting nozzle to a recognizing position so as to be able to recognize a projected shape of the attracted electronic part in a perpendicular direction or a flat or top plan shape thereof by a shape and position recognizing camera, with simultaneous recognition of the attracted position, and thereafter, to move the attracting nozzle to a position confronting a part mounting position of a printed circuit board with respect to the electronic part having a proper shape so as to correct the amount of positional deviation in the attracting position for mounting the electronic part at a predetermined position on the printed circuit board.

In the above procedure, since the flat or top plan shape of the electronic part is recognized before attaching, and defects, for example, bending of leads in a horizontal direction, breakage, chipping, etc. are detected, only defect free electronic parts will be mounted on the printed circuit board, and thus, there is no possibility that an entire printed circuit board undesirably becomes useless due to the attaching of a single defective electronic part.

However, in the known electronic part mounting apparatus as described above, there are such problems that, for example, where there is bending of the leads in a perpendicular direction, such a bending can not be detected, resulting in rising of a part of the leads when the leads are mounted on the printed circuit board, and thus, generation of a defect due to faulty connection between the electrodes of the printed circuit board and the leads can not be prevented. Particularly, in recent years, bending of leads in horizontal and perpendicular directions is apt to take place since leads tend to be narrow in width and thin because of an increase in the number of leads, so that solving of the above disadvantage is a very important problem.

In connection with the above, there has also previously been proposed and assigned to the same assignee as in the present invention, another part mounting apparatus in which a plurality of light projecting means and recognizing cameras are provided around four sides of the part travelling passage so as to confront each other so that the shape of the part in the perpendicular direction can also be recognized, but since such an arrangement requires a plurality of light projecting means and recognizing cameras, an increase in cost undesirably occurs, while due to the fact that only the projected image can be recognized, the amount of information available thereby is limited.

SUMMARY OF THE INVENTION

Accordingly, an essential object of the present invention is to provide a part mounting apparatus which is capable of recognizing a shape of a part both in horizontal and perpendicular directions to achieve higher part mounting reliability.

Another object of the present invention is to provide a part mounting apparatus of the above described type in which the amount of available information can be increased for positive control of the part mounting A further object of the present invention is to provide a part mounting apparatus of the above described type, which is simple in construction and stable in functioning, and can be readily constructed at low cost.

In accomplishing these and other objects, according to one preferred embodiment of the present invention, there is provided a part mounting apparatus which includes a part holding/transfer means which holds the part at a part supply position for transfer thereof to a predetermined part mounting position for mounting, a shape and position recognizing means for recognizing the shape of the part held by said part holding/transfer means, and an inclined mirror means for inputting into the recognizing means, an image of the shape of the part in a direction perpendicular to a direction of the optical axis of the recognizing means.

More preferably, the part mounting apparatus further includes means for adjusting the relative position, in the optical axis direction, of said recognizing means and said held part, with the inclined mirror means having a square frame-like shape as viewed from the direction of the optical axis.

The arrangement of the present invention as described above may, for example, be so modified, that the inclined mirror means has an L shape or straight line shape, and said part mounting apparatus further includes means for adjusting the relative position, in a direction perpendicular to an optical axis with respect to the inclined mirror means, of said part holding/transfer means and said recognizing means, with said part holding/transfer means being provided with means for rotating the held part about an axis parallel to the optical axis.

According to the present invention as described above, during the holding or transfer process of the part immediately before mounting, the shape of the part in the optical axis direction is directly recognized, while the shape in the perpendicular direction with respect to the optical axis is recognized through the inclined mirror by the recognizing means, whereby the part can be properly mounted with high accuracy after confirming that it has the proper configuration in any direction, without deformation in the part shape thereafter up to the mounting.

Moreover, by providing the position adjusting means for adjusting the position in the optical axis direction of the recognizing means, the difference in the optical paths in the image through the inclined mirror may be absorbed by the positional adjustment of the recognizing means, and thus, it becomes possible to focus onto any desired point of the part for recognition even when a single simple recognizing camera is employed as the recognizing means.

Furthermore, by forming the reflection mirror into the square frame-like configuration, the shape of the part may be checked from five directions.

Additionally, instead of positionally adjusting the recognizing means in the optical axis direction, by employing an inclined mirror having an L-shape or straight line shape as viewed in the optical axis direction, and also, by positionally adjusting the part holding/transfer means and recognizing means in the direction perpendicular to the optical axis with respect to the inclined mirror, it is possible to recognize by the recognizing means in the focused state both in the optical axis a direction and direction perpendicular thereto. Similarly, in the case where the shape of the part is to be recognized in another direction perpendicular to the optical axis, the apparatus may be so arranged to effect the above recognizing function by rotating the held part about an axis parallel to the optical axis by the part holding/transfer means.

BRIEF DESCRIPTION OF THE DRAWINGS

These and other objects and features of the present invention will become apparent from the following description of a preferred embodiment thereof with reference to the accompanying drawings, in which.

DETAILED DESCRIPTION OF THE INVENTION

Figure 1:
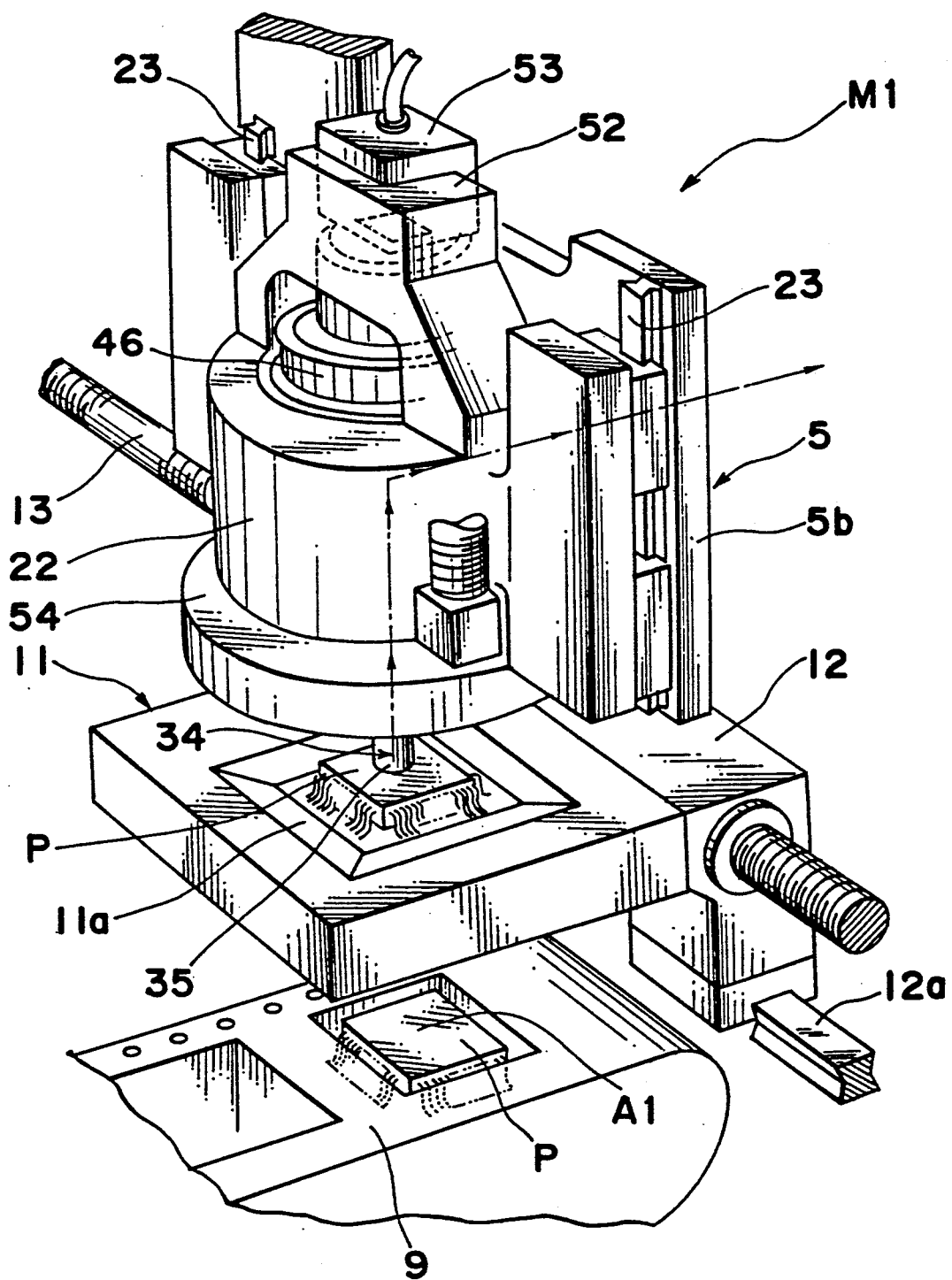
FIG. 1 is perspective view of an essential portion of a part mounting apparatus M1 according to one preferred embodiment of the present invention.

Before the description of the present invention proceeds, it is to be noted that like parts are designated by like reference numerals throughout the accompanying drawings.

Figure 2:
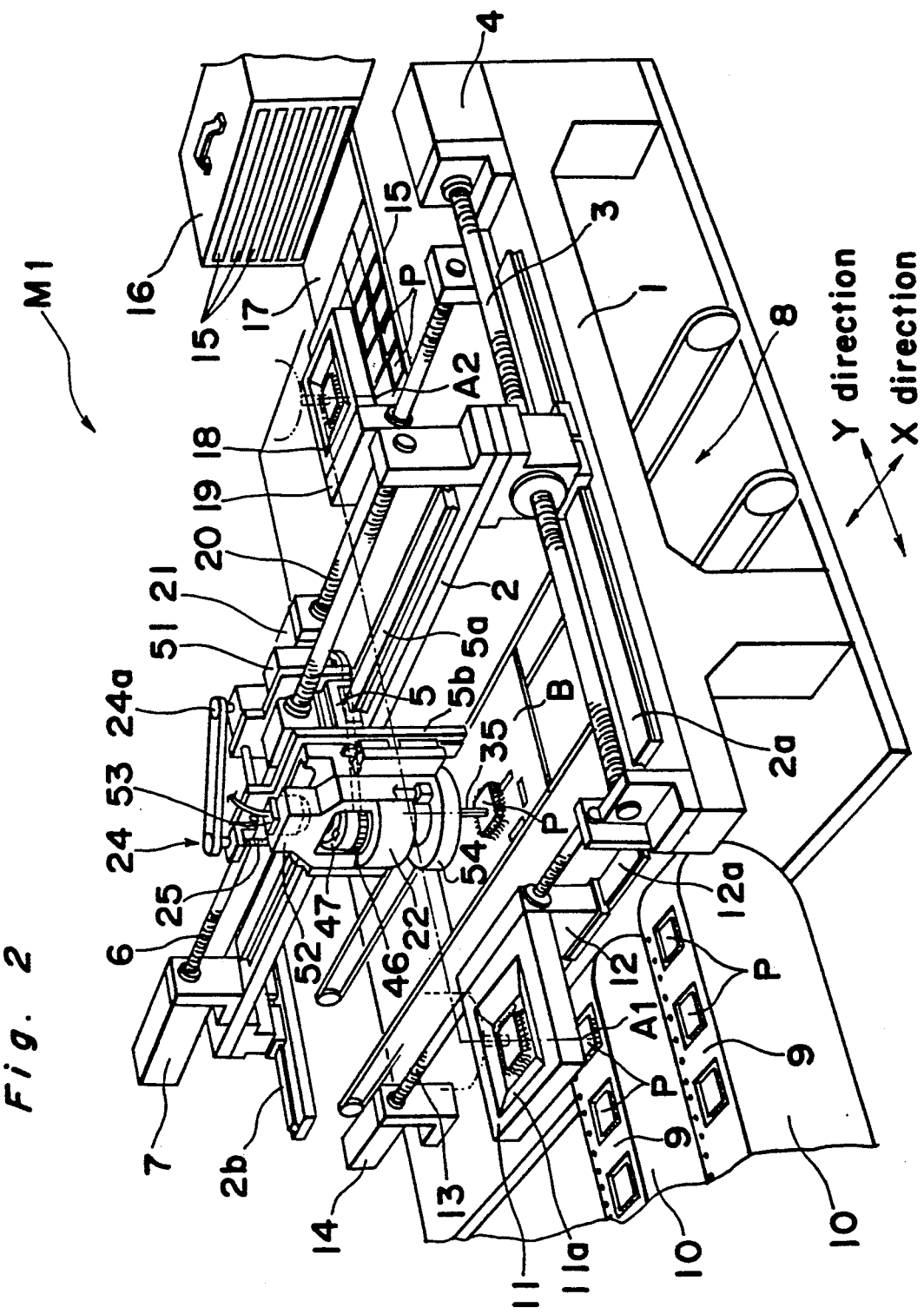
FIG. 2 is also a perspective view showing the entire construction of the part mounting apparatus M1 of FIG. 1.
Figure 3:
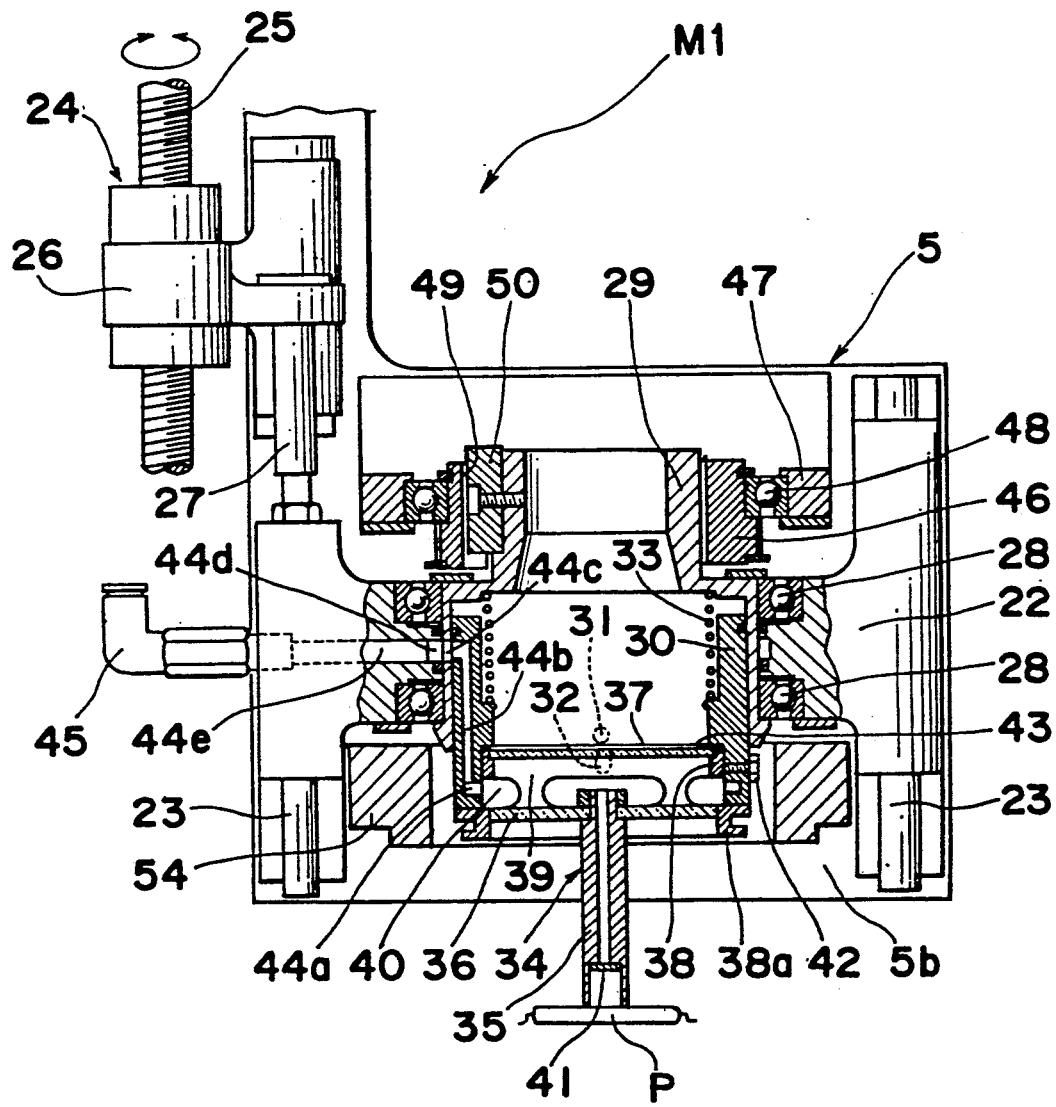
FIG. 3 is a side elevational view, partly in section of an attracting nozzle portion employed in the part mounting apparatus M1 of FIG. 1, FIGS. 4(a) and 4(b) are perspective views of a monitor television screen showing images in various recognizing states.

Referring now to the drawings, there is shown in FIGS. 1 to 3, an electronic part mounting apparatus M1 according to one preferred embodiment of the present invention.

As shown in FIG. 2 showing the overall construction, the part mounting apparatus M1 generally includes a base 1, and a Y axis table 2 arranged to be driven thereover back and forth (i.e. in the Y direction indicated by an arrow). The Y axis table 2 extending in an X direction intersecting at right angles with the Y direction, is displaceably guided at its opposite ends by a set of straight guides 2a and 2b provided at left and right side edges of the base 1. Along the straight guide 2a, a feed screw 3 for driving the Y axis table 2 associated with a driving motor 4 is provided for engagement with one end of said table 2. On the Y axis table 2, a movable member 5 is mounted so as to be driven in the X direction along a straight guide 5a by a feed screw 6 engaged with a driving motor 7. By the above arrangement, the movable member 5 may be positioned at any desired position in the X and Y directions by the driving motors 4 and 7.

At the front portion (i.e. at the left side in FIG. 2 of the Y axis table 2), there is provided transport and positioning means to carry-in a printed circuit board B to have an electronic part P mounted thereon at a predetermined position, and to carry-out said circuit board after mounting of such electronic part P thereon.

At the forward portion of the base 1, a plurality of part supply units 10 (two units 10 are shown in FIG. 2) each having a tape-like part assembly 9 accommodating therein electronic parts P in one line, are disposed in a parallel relation in a lateral direction (i.e. in the X direction) so as to successively deliver the electronic parts P towards a part supply position A1 at the forward end thereof. Moreover, an inclined mirror frame 11 of a square frame-like shape in a top plan configuration and having a passage opening for receiving the electronic part P at the central portion is mounted on a displaceable member 12 movable in the X direction at the forward edge portion of the base 1 so as to be positioned above and confronting the part supply position A1 of the respective part supply units 10. The above inclined mirror frame 11 has, in its inner peripheral portions, four reflecting faces 11a each inclined about 45°, thereby to project images of four peripheral side faces of the electronic part P located inside the frame generally vertically in an upward direction. The displaceable member 12 is guided by a straight guide 12a so as to be driven by a feed screw 13 coupled with a driving motor 14.

On the other hand, at the back of the base 1, there is disposed a tray supply means 16 arranged to accommodate trays 15 in a plurality of stages, each containing electronic parts P in a checker pattern as shown, and to feed out any desired tray 15 onto a tray transfer means 17 provided on the rear portion of the base 1. The tray transfer means 17 referred to above is adapted to be capable of positioning any desired row of the electronic parts P in the tray 15 at the part supply position A2 at the rear. Furthermore, another inclined mirror frame 18 similar to the inclined mirror frame 11 described earlier is mounted on a displaceable member 19 movable in the X direction so that it can be positioned above and confronting any desired electronic part P of the row of the electronic parts P located at the part supply position A2. The displaceable member 19 is driven by a feed screw 20 coupled with a driving motor 21.

In FIGS. 1 and 3 showing the movable member 5 in detail, on a perpendicular fixing face 5b of the movable member 5, an elevating member 22 is mounted for ascending and descending in a two-axis direction. This elevating member 22 is guided for free ascending or descending movement on a pair of spaced straight guides 23 provided at opposite sides of the fixing face 5b, and is arranged to be raised or lowered by an elevating driving means 24 mounted on the movable member 5. The above elevating driving means 24 includes a feed screw 25 which is driven in rotation by a rotation driving means 24a, an elevation driving piece 26 (FIG. 3)

having a nut engaged with said feed screw 25 and guided for rising or lowering by one straight guide 23 and a connecting piece 27 for connecting the elevating member 22 with the elevation driving piece 26.

As shown in FIG. 3, within the elevating member 22, a rotary cylinder 29 is rotatably mounted in a set of upper and lower bearings 28. The lower portion of said rotary cylinder 29 is formed into a larger diameter portion, with a fixing cylinder 30 being fitted to its inner peripheral surface. A guide pin 31 is provided which projects from the inner peripheral surface adjacent to the lower edge of the rotary cylinder 29 so as to be engaged with an elongated opening 32 formed in the fixing cylinder 30, thereby to prevent relative rotation between said rotary cylinder 29 and the fixing cylinder 30 for ascending or descending in a predetermined range, while a coil spring 33 is disposed between the rotary cylinder 29 and the fixing cylinder 30 for urging said cylinder 30 downwardly, thereby to allow the fixing cylinder 30 to retreat into the lower portion of the rotary cylinder 29 during mounting of the electronic parts. On the inner peripheral portion at the lower portion of the fixing cylinder 30, a suction or attracting nozzle 34 is detachably mounted.

The attracting nozzle 34 referred to above includes a nozzle portion 35, a transparent or see-through plate 36 fixed to the upper end of said nozzle portion 35, a light-transmitting plate 37 disposed above the transparent plate 36 with a predetermined distance or space therebetween, and a suction cylinder 38 to which said transparent plate 36 and light-transmitting plate 37 are integrally connected at the lower and upper edges of said suction cylinder 38, with a suction chamber 39 being defined by the transparent plate 36, the light-transmitting plate 37 and the suction cylinder 38.

In the peripheral wall of the suction cylinder 38, a plurality of suction holes 40 are formed spaced in the circumferential direction at predetermined intervals transparent plate 36. The attracting nozzle 34 has a filter 41 disposed in its nozzle portion 35, and is releasably fixed to the fixing cylinder 30 by a resilient stopping member 42 to permit exchanging the attracting nozzle 34 in one operation so that it will correspond to the size of the electronic part P to be attracted. Around the lower peripheral edge of the suction cylinder 38, a flange portion 38a is provided for engagement with a jig (not shown) during attaching or detaching by the jig. A packing 43 is disposed between the upper edge of the suction cylinder 38 and a stepped portion formed in the inner periphery of the fixing cylinder 30.

In the inner peripheral wall at the lower portion of the fixing cylinder 30, an annular groove 44a is formed which confronts said suction holes 40, and this annular groove 44a is open at the upper portion of the outer peripheral surface of the fixing cylinder 30 through a passage 44b so as to be communicated with a through-bore 44c formed in the rotary cylinder 29, and further, through an annular opening 44d formed in the inner peripheral surface of said elevating member 22, opens outside through a passage 44e formed in said elevating member 22, and thus can be connected to a suction means (not shown) through a connector 45.

The upper portion of the rotary cylinder 29 is formed with a smaller diameter, and provided is with a toothed pulley 46 on its outer peripheral portion. This toothed pulley 46 is rotatably supported in a bearing 48 mounted in a bracket 47 disposed on the fixing surface 5b of the movable member 5, while a key 50 attached to the outer periphery of the rotary cylinder 29 is engaged with a key way 49 formed in the inner periphery of the toothed pulley 46. As shown in FIG. 2, the toothed pulley 46 is arranged to be rotated to any desired rotated position by a driving motor 51 provided on the movable member 5.

Moreover, on a fixing portion 52 extending upwardly from the elevating member 22, is mounted a shape and position recognizing camera 53 directed downwardly and fixed on the same axis as that of the rotary cylinder 29. This recognizing camera 53 is so arranged that it can be automatically focused for each region which may be designated as desired to be viewed within the recognizing visual field thereof. It is to be noted here that a camera having a sufficiently large focal depth may be employed as the recognizing camera. Around the outer periphery at the lower portion of the rotary cylinder 29, an annular illuminating unit 54 is provided.

The operation of the part mounting apparatus M1 as described thus far will be explained.

In the first place, through operation of the driving motors 4 and 7, the Y-axis table 2 and the movable member 5 are displaced to bring the attracting nozzle 34 to a position above and confronting the part supply position A1 for the part supply unit 10 in which the electronic part P to be mounted is accommodated. Meanwhile, the displaceable member 12 is also moved in association therewith so as to bring the inclined mirror frame 11 into a position above and confronting the same part supply position. By the elevation driving means 24, the nozzle 34 is stopped in a state where the forward end of the nozzle portion 35 is located slightly above the electronic part P, and thus, the shape and position of the electronic part P are viewed and roughly recognized by the recognizing camera 53 through the transparent plate 36 and the light-transmitting plate 37.

In the case where the configuration of the electronic part P thus recognized is found to be improper, the attracting or sucking function is not started, and the next electronic part P is fed into the supply position by operating the part supply unit 10 so as to again enable recognition of its configuration by the recognizing camera 53.

If the shape of the electronic part P is proper this time, the elevating member 22 is further lowered to effect the attraction of the electronic part P by the nozzle 35. It is to be noted here that, although the suction chamber 39 is evacuated to a vacuum by a vacuum attracting means (not shown) so as to draw-in external air through the nozzle portion 35, since dust or the like in the suction air is removed by the filter 41 before being drawn into the suction chamber 39, there is no possibility that dust or the like adheres onto the upper surface of the transparent plate 36 and the lower surface of the light-transmitting plate 37. Thereafter, when the forward end of the nozzle portion 35 contacts the upper surface of the electronic part P, said electronic part is held thereonto.

Figure 4A:
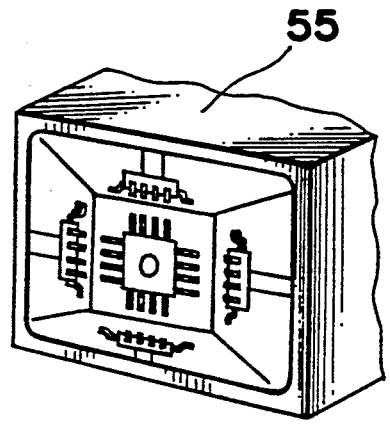

Upon holding of the electronic part P, the elevating means 22 is raised by the elevation driving means 24, and the electronic part P thus held is stopped in a state where it is located within the opening of the inclined mirror frame 11. In this state, the shape of the electronic part P at its four side faces is viewed and recognized by the recognizing camera 53 through the inclined mirror frame 11. Such a viewed image is, for example, displayed as shown in FIG. 4(a) where the image is divided into five portions, i.e. the central portion and the four sides, on a screen of a monitor television 55, and in the case where any vertical bending of the leads at the four sides of the electronic part P is present, it can be detected in the images of the four sides. Of course, such image recognition is not effected by visual examination, but the recognizing processing is carried out by an image processing means. When bending in the vertical direction is present in the leads of the electronic part P, said part is transported to a collecting station (not shown), and the next electronic part P is attracted for examination. The above arrangement may, for example, be so modified that the bending of leads is corrected at a lead correcting station in a later process (not shown).

Subsequently, after raising the elevating member 22 up to a position at a predetermined height by the elevation driving means 24, the movable member 5 is moved, and the electronic part P held by the attracting nozzle 34 is transported towards the position above the predetermined mounting position of the printed circuit board B. During the above transportation, the position of the attracted electronic part P is accurately recognized by the recognizing camera 53 and the amount of deviation or eccentricity and angle of inclination in the X direction and Y direction of the electronic part P with respect to the coordinate system of the recognizing camera 53 are detected by the image processing means.

Figure 4B:
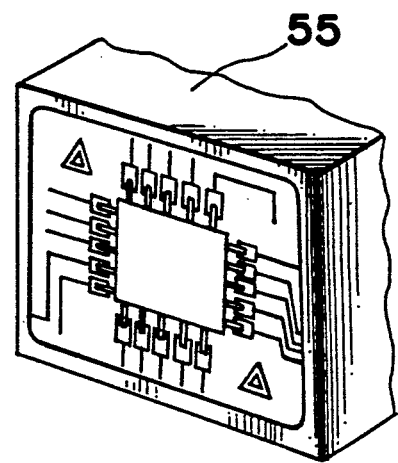

Thereafter, when the held electronic part P is located above the part mounting position of the printed circuit board B, the deviation of amount the attracted electronic part P with respect to the axis of the recognizing camera 53 is corrected, and the rotary cylinder 29 is rotated by the driving motor 51 according to the mounted posture of the electronic part P, for simultaneous correction of the inclination angle with respect to the coordinate system, and thereafter, the elevating member 22 is lowered so as to stop in a position immediately before the electronic part P contacts the printed circuit board B. Then, the part mounting position of the printed circuit board B is viewed and recognized by the recognizing camera 53. The recognized image is displayed on the screen of the monitor television 55 as illustrated in FIG. 4(b), while simultaneously, the relative position between the electrode at the part mounting position of the printed circuit board B and the lead of the electronic part P is detected.

After re-adjusting the position of the electronic part P according to the result of the above detection, the elevating member 22 is lowered to bring the electronic part into contact with the printed circuit board B at the part mounting position and by ending the attraction by printed circuit board B, and by releasing the attraction by feeding air into the suction chamber 39, the electronic part P is released at a position in which it is mounted at the predetermined position on the printed circuit board B. Furthermore, the above mounted state of the electronic part P is viewed and recognized by the recognizing camera 53 for examination and thereafter, the elevating member 22 is raised and the movable member 5 is displaced to the part supply position again.

By repeating the above functions, proper electronic parts P can be successively mounted at the electronic part mounting position on the printed circuit board B. Also mounting the electronic parts P accommodated within the tray 1, can be effected by similar operations.

Figure 5:
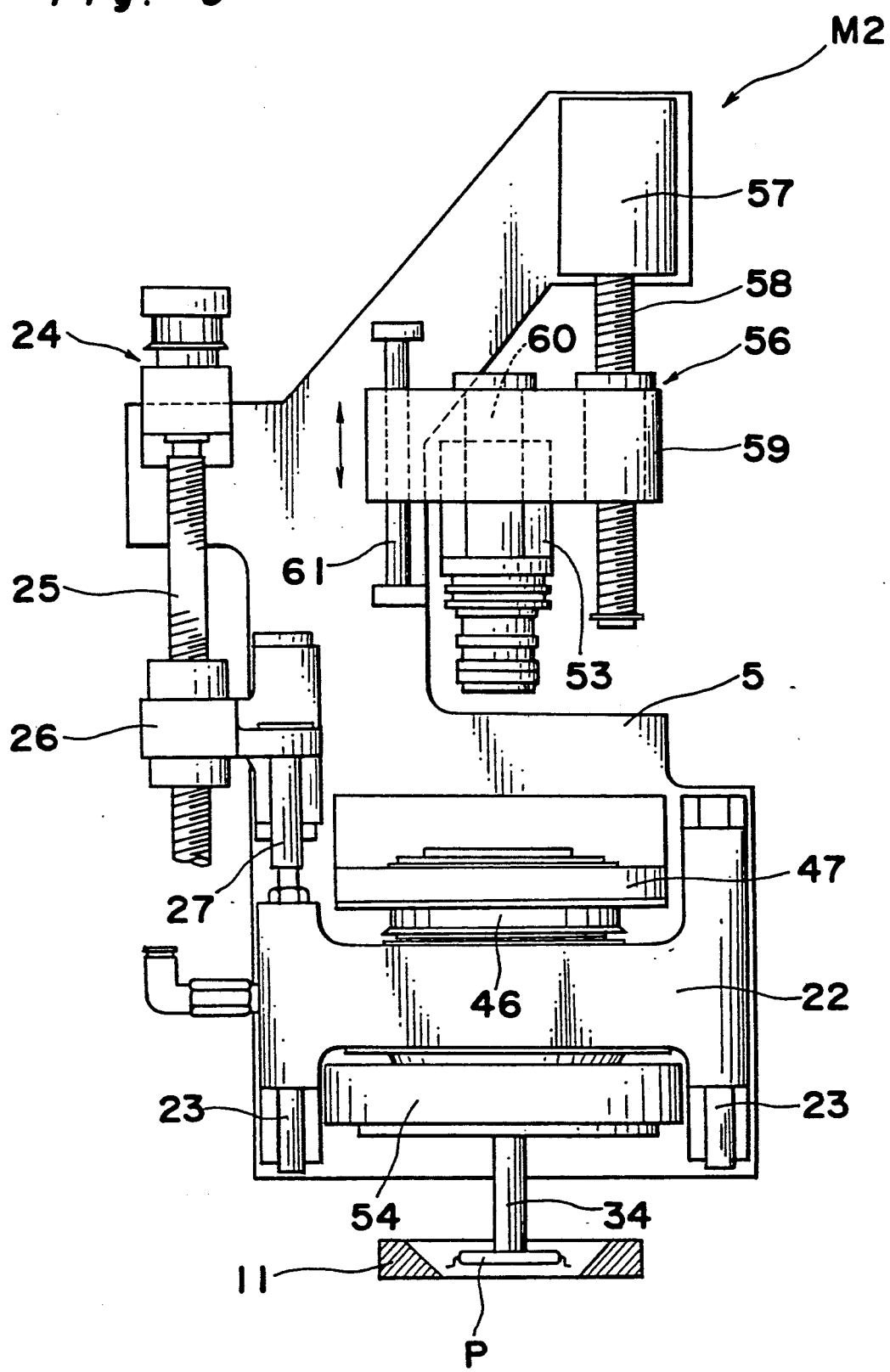
FIG. 5 is a side elevational view showing an essential portion of a part mounting apparatus M2 according to a second embodiment of the present invention.

Referring further to FIGS. 5 and 6, the part mounting apparatus M2 according to a second embodiment of the present invention will be explained hereinbelow.

In the part mounting apparatus of the first embodiment as described so far, although there has been shown, as one example, a camera capable of automatically focusing for each designated area or a camera having a large depth of focus as the recognizing camera, such arrangement may involve, in some cases, a certain disadvantage such as an increase in the overall cost or deterioration in the recognizing accuracy.

Accordingly, in the second embodiment of the present invention, the part mounting apparatus M2 is provided with a camera position adjusting means 56 for adjusting the position of the recognizing camera 53 in the axial direction thereof as shown in FIG. 5. The camera position adjusting means 56 is comprised of a mounting bracket 60 mounted on an elevating member 59 adapted to be driven for ascending or descending by a feed screw 58 coupled with a driving motor 57. A guide 61 for the elevating member 59 is also mounted on the movable member 5 in a similar manner as the driving motor 57.

Figure 6A:
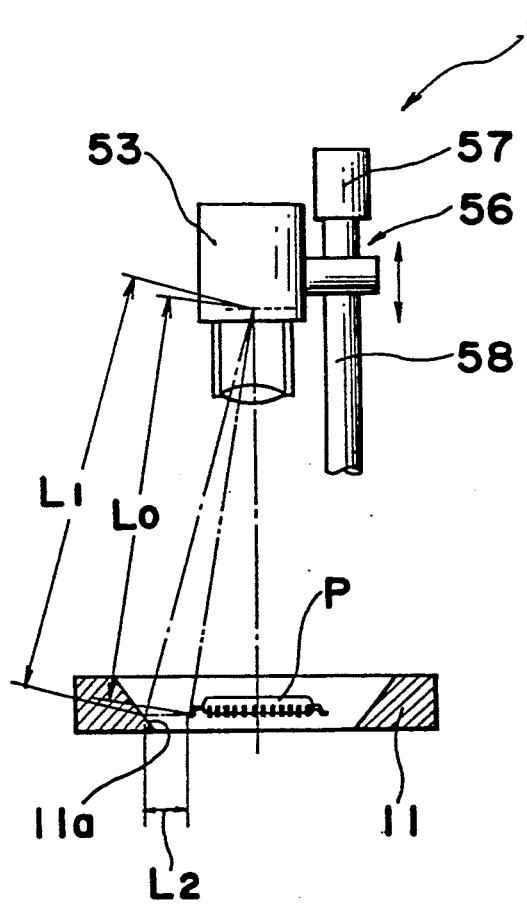
FIGS. 6(a) and 6(b) are schematic side elevational views of the part mounting apparatus M2 in FIG. 5 for explaining positional adjustment of a recognizing camera employed therein.
Figure 6B:
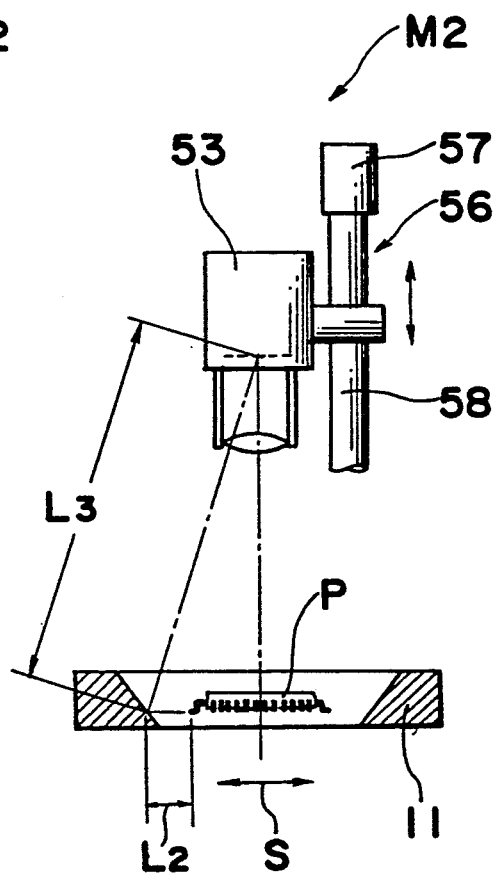

Here, on the assumption that the in-focus distance of the recognizing camera 53 is represented by Lo, the recognizing camera 53 is first positioned so that an optical path length between the recognizing camera 53 and the leads of the electronic part P becomes Lo as shown in FIG. 6(a) for recognizing the top plan shape of the leads for the electronic apart P. In the above case, since the image obtained when the leads of the electronic part P are viewed from the side face is that obtained through the reflecting face 11a of the inclined mirror frame 11, the optical path length thereof is represented by $$L1+L2>Lo,$$

thus not providing clear and definite recognition. Subsequently, as shown in FIG. 6(b), the recognizing camera 53 is displaced by the camera position adjusting means 56 so that the optical path length between the recognizing camera 53 and the lead becomes L3+L2=Lo, thereby to be able to view and recognize the forward end positions of the leads at the four sides of the electronic part P from the side portion through the reflecting face 11a of the inclined mirror frame 11. Furthermore, it may be so arranged that, by displacing the recognizing camera 53 depending on necessity, the in-focus position thereof is moved in a direction indicated by an arrow S so as to successively focus on each lead arranged in the S direction, thereby to accurately recognize the state of any leads which are bent.

Since other constructions and operations of the part mounting apparatus M2 of FIGS. 5 to 6(b) are basically similar to those of the first embodiment, a detailed description thereof is omitted here for brevity of explanation.

Figure 7:
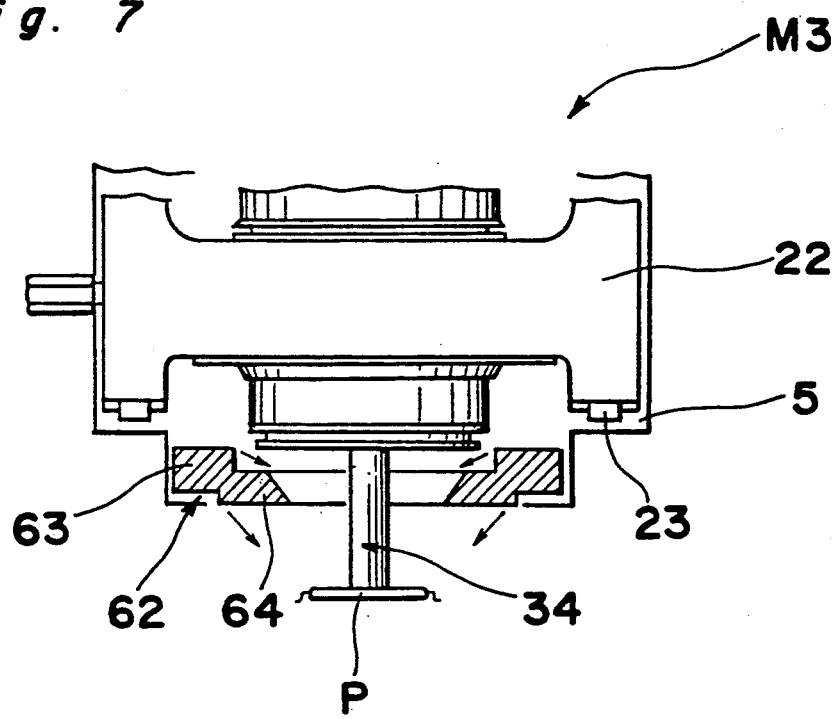
FIGS. 7 and 8 are fragmentary side elevational views showing, on an enlarged scale, an attracting nozzle portion of a part mounting apparats M3 according to a third embodiment of the present invention.
Figure 8:
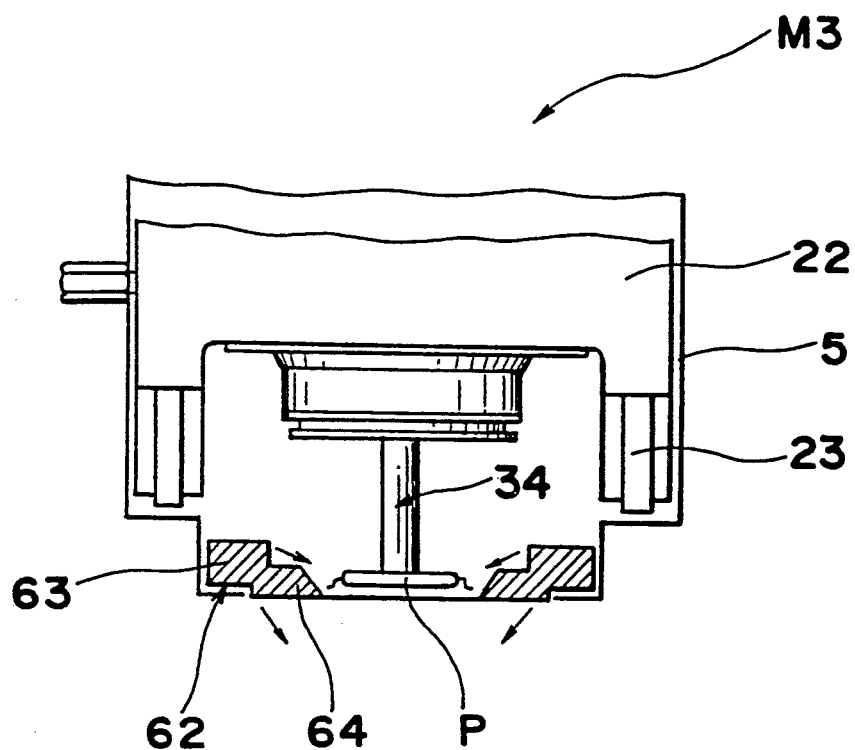

Referring further to FIGS. 7 and 8, the part mounting apparatus M3 according to a third embodiment of the present invention will be described hereinafter.

In the foregoing embodiments, although the inclined mirror frame 11 is arranged to be movable in the X direction to a position above the part supply position A1, with the illuminating unit 54 being mounted on the elevating member 22, the arrangement is modified in the third embodiment so that there is provided a combined illuminating portion/inclined mirror frame 62 in which an inclined mirror portion 64 is disposed as one unit in the inner peripheral portion of an illuminating portion 63.

In the third embodiment also, the mounting function of the electronic part P is fundamentally the same, and as shown in FIG. 7, the electronic part P is recognized as to its top plan shape before or after attraction, and thereafter, further recognized as to the shapes of its four side faces by raising the attracting nozzle 34 to position the electronic part P inside the inclined mirror portion 64. In this embodiment also, even when a simple recognizing camera with a fixed focal point is employed and such recognizing cameras 53 is fixedly mounted, in-focus viewing can be achieved both in the states of FIGS. 7 and 8.

A part mounting apparatus M4 according to a fourth embodiment of the present invention will be described with reference to FIGS. 9 to 12.

In the second embodiment as described above, although the recognizing camera 53 is adapted to be moved in the optical axis direction by the camera position adjusting means 56 to align the recognizing position with the in-focus position, in the fourth embodiment M4 the recognizing camera 53 is fixed to the movable member 5, and an L-shaped inclined mirror 65 is disposed in a position at a proper height in the vicinity of the part supply position.

Figure 9:
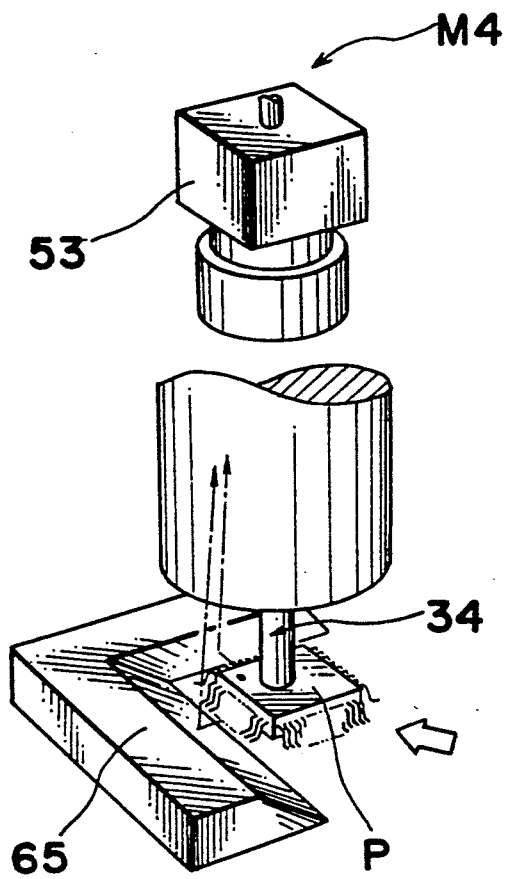
FIGS. 9 and 10 are fragmentary perspective views of an attracting nozzle portion of a part mounting apparatus M4 according to a fourth embodiment of the present invention, each showing the state during recognition.
Figure 12:
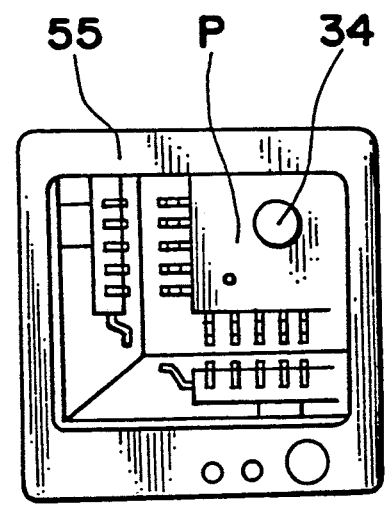
FIG. 12 is a front elevational view showing an image on the monitor television.

More specifically, in the fourth embodiment, the electronic part P is attracted by the attracting nozzle 34 at the part supply position A1 its shape in the plan direction by the recognizing camera 53, and then, after raising the attracting nozzle 34 to bring the electronic part P up to a height corresponding to the L-shaped inclined mirror 54, the movable member 5 is moved in the horizontal direction so as to displace the recognizing camera 53 and the attracting nozzle 34 as one unit, and thus, as shown by an arrow in FIG. 9, the leads on the neighboring two side faces of the electronic part P are gradually brought close to the L-shaped inclined mirror 65, with the parallel relation of the sides and the mirror being maintained, and stopped when said leads on the two side faces have arrived at the in-focus position of the recognizing camera 53. In the manner as described above, the shapes and positions of such leads may be viewed and recognized by the camera 53 through the L-shaped inclined mirror 65. As shown in FIG. 12, the viewed image is displayed on the screen of the monitor television 55.

Figure 10:
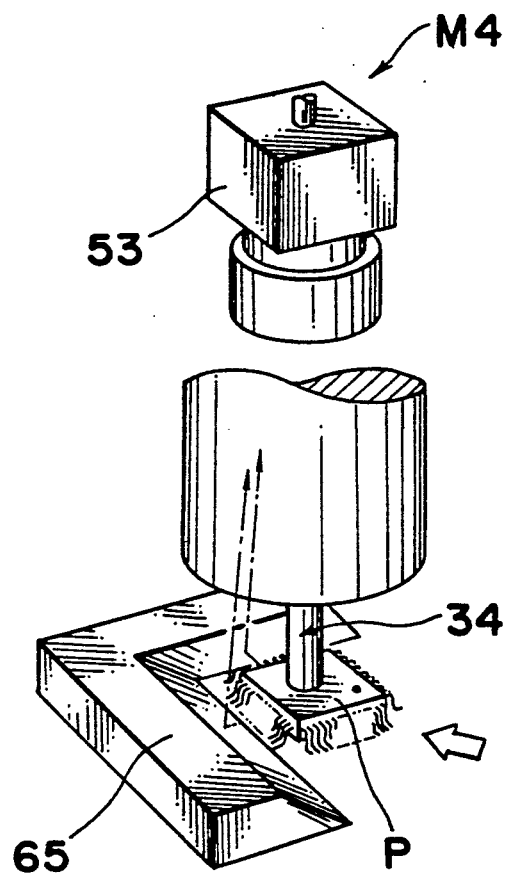
Figure 11:
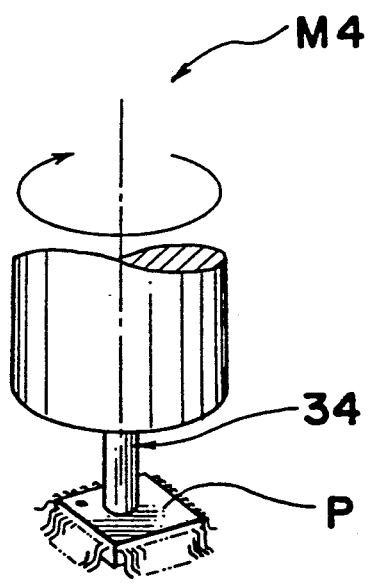
FIG. 11 is a view similar to FIGS. 9 and 10, which particularly shows a change-over of the recognizing position.

Thereafter, for viewing and recognizing the leads on the other two side faces, the movable member 5 is displaced a sufficient distance in a direction opposite to that indicated by the arrow in FIG. 9, so that the part P is clear of the mirror 65 and after rotating the attracting nozzle 34 through 180° as shown in FIG. 11, the electronic part P is moved back towards the inclined mirror 65 in the direction of the arrow in the similar manner as in FIG. 9, to the position of FIG. 10 so that the leads are at the in-focus state. In the fourth embodiment, even when the size of the electronic part P varies greatly from operation to operation, the recognition may be effected without necessity for exchanging the inclined mirror frame.

It should be noted here that, in the fourth embodiment as described above, although the L-shaped inclined mirror 65 has been employed, the mirror may be replaced by a straight inclined mirror. In this case, however, it becomes necessary of reciprocate the movable member 5 a plurality of times, while rotating the attracting nozzle 34 90° each time, in the case where shapes of a plurality of side faces are to be recognized, thus taking more time for the recognition.

It should also be noted that such inclined mirror may be mounted on the movable member 5 for relative movement in the horizontal direction with respect to the attracting nozzle 34 and the recognizing camera 53.

It should further be noted here that, in the foregoing embodiments, although the inclined mirror is provided above the part attracting position or in the vicinity thereof, or on the movable member, the arrangement may, for example, be so modified that a recognizing station having the inclined mirror and recognizing camera is provided along and under a path for the attracted part during transfer, and at this recognizing station, the electronic part is lowered down to a position corresponding to the inclined mirror for recognition of its shapes in the plan direction and on the side faces.

As is clear from the foregoing description, by the part mounting apparatus according to the present invention, during the holding or transfer process of the part immediately before mounting, the shape of the part in the optical axis direction is directly recognized, while that in the perpendicular direction with respect to the optical axis is recognized through the inclined mirror by the recognizing means, whereby the part can be properly mounted with high accuracy after confirming that it has the proper configuration in each direction, without deformation in the part shape thereafter up to the mounting. Owing to the employment of the inclined mirror, shapes of the electronic part in any direction may be recognized by the single recognizing means as described above, and thus, the apparatus can be constructed at low cost. Moreover, by further adjusting the disposition of the inclined mirror and the in-focus position of the recognizing camera, part shapes at any position may be recognized from any desired direction, and therefore, the amount of information available can be increased, while part mounting with extremely low generation of errors can be achieved.

Moreover, by providing the position adjusting means for adjusting the position of the recognizing means in the optical axis direction, the difference in the optical paths of the image through the inclined mirror can be eliminated by the positional adjustment of the recognizing means, and thus, it becomes possible to focus onto any desired point of the part for recognition even when a single simple viewing and recognizing camera is employed as the recognizing means.

Furthermore, by forming the reflection mirror into a square frame-like configuration, the shape of the part can be checked from five directions.

Additionally, instead of positionally adjusting the recognizing means in the optical axis direction, by employing an inclined mirror having an L-shape or straight line shape as viewed in the optical axis direction, and also, by positionally adjusting the part holding/transfer means and recognizing means in the direction perpendicular to the optical axis with respect to the inclined mirror, it is possible to view the part with the recognizing means in the focused state both in the optical axis direction and direction perpendicular thereto. Similarly, in the case where the shape of the part is to be recognized in another direction perpendicular to the optical axis, it may be so arranged to effect the above recognizing function by rotating the held part about the axis parallel to the optical axis by the part holding/transfer means.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A part mounting apparatus comprising:

a part holding/transfer means for picking up a part at a part supply position and movable in at least a Z direction among mutually perpendicular X, Y and Z directions for transferring the picked up part to a predetermined part mounting position for mounting;

a single viewing and recognizing means having a optical viewing axis in the Z direction for viewing and recognizing an image of a shape and position of a part held by said part holding/transfer means and mounted on said apparatus so as at the most, to be movable in the direction of said optical viewing axis;

an inclined mirror means having a mirror surface inclined to a plane defined by said X and Y directions for reflecting a further image of the shape of a part held by said part holding/transfer means which further image is the image of the part perpendicular to the direction of the optical axis of said viewing and recognizing means; and means for moving said part holder/transfer means and said inclined mirror means relative to each other at least in the Z direction for positioning a part held thereby relative to said inclined mirror means for causing the mirror means to reflect the further image of the part into said single viewing and recognizing means, whereby the single viewing and recognizing means can simultaneously view and recognize the image of the part being held by said part holding/transfer means taken from two mutually perpendicular directions.

2. A part mounting apparatus as claimed in claim 1 further comprising means for adjusting the position of said part holding/transfer means and said viewing and recognizing means relative to each other in the direction of said optical viewing axis.

3. A part mounting apparatus as claimed in claim 1 in which said inclined mirror means is a rectangular frame-like means having inclined mirror surfaces on the inside surface of all four sides thereof and is positioned with the plane of said rectangular frame-like means perpendicular to said optical viewing axis.

4. A part mounting apparatus as claimed in claim 2 in which said inclined mirror means is a rectangular frame-like means having inclined mirror surfaces on the inside surface of all four sides thereof and is positioned with the plane of said rectangular frame-like means perpendicular to said optical viewing axis.

5. A part mounting apparatus as claimed in claim 1 in which said inclined mirror means is an L-shaped means having two perpendicular sides lying in a plane perpendicular to said optical viewing axis, and having inside surfaces and said inside surfaces being mirror surfaces, and said apparatus further comprises means for moving said part holding/transfer means and said mirror means relative to each other in a direction perpendicular to the plane of the sides of said L-shaped means and for rotating said part holding/transfer means around an axis parallel to said optical viewing axis.

6. A part mounting apparatus as claimed in claim 1 in which said inclined mirror means is a straight member lying in a plane perpendicular to said optical viewing axis and having an inside surface which is a mirror surface, and said apparatus further comprises means for moving said part holding/transfer means and said inclined mirror means relative to each other in a direction perpendicular to the plane in which said straight member lies and for rotating said part holding/transfer means around an axis parallel to said optical viewing axis.

7. A part mounting apparatus as claimed in claim 1 in which said part holding/transfer means further includes a light transmitting means for passing light from a part being carried by said part holding/transfer means to said viewing and recognition means.

* * * * *